United States Patent
Huang et al.

(10) Patent No.: US 11,398,559 B2
(45) Date of Patent: *Jul. 26, 2022

(54) MITIGATION OF TIME DEPENDENT DIELECTRIC BREAKDOWN

(71) Applicant: Taiwan Semiconductor Manufacturing, Co., Ltd., Hsinchu (TW)

(72) Inventors: Yi-Jyun Huang, New Taipei (TW); Bao-Ru Young, Hsinchu (TW); Tung-Heng Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/851,079

(22) Filed: Apr. 16, 2020

(65) Prior Publication Data
US 2020/0243663 A1      Jul. 30, 2020

Related U.S. Application Data

(63) Continuation of application No. 15/599,045, filed on May 18, 2017, now Pat. No. 10,658,486.

(51) Int. Cl.
*H01L 29/49*     (2006.01)
*H01L 29/78*     (2006.01)
(Continued)

(52) U.S. Cl.
CPC .... *H01L 29/4966* (2013.01); *H01L 21/28105* (2013.01); *H01L 29/4983* (2013.01);
(Continued)

(58) Field of Classification Search
CPC .......... H01L 21/00274; H01L 21/0228; H01L 21/28105; H01L 29/401; H01L 29/4236; H01L 29/42364; H01L 29/4966; H01L 29/4983; H01L 29/66348; H01L 29/66545; H01L 29/6656; H01L 29/66871; H01L 29/78; H01L 21/02274; H01L 29/66553
See application file for complete search history.

(56) References Cited

U.S. PATENT DOCUMENTS 5,181,087 A   1/1993  Usagawa et al.
5,464,782 A   11/1995 Koh
(Continued)

FOREIGN PATENT DOCUMENTS

KR       10-0856436 B1    9/2008
KR    10-2009-0064746 A   6/2009
(Continued)

*Primary Examiner* — Mary A Wilczewski
(74) *Attorney, Agent, or Firm* — Sterne, Kessler, Goldstein & Fox P.L.L.C.

(57) ABSTRACT

The present disclosure describes an exemplary replacement gate process that forms spacer layers in a gate stack to mitigate time dependent dielectric breakdown (TDDB) failures. For example, the method can include a partially fabricated gate structure with a first recess. A spacer layer is deposited into the first recess and etched with an anisotropic etchback (EB) process to form a second recess that has a smaller aperture than the first recess. A metal fill layer is deposited into the second recess.

20 Claims, 8 Drawing Sheets

(51) Int. Cl.
*H01L 21/28* (2006.01)
*H01L 21/336* (2006.01)
*H01L 29/66* (2006.01)

(52) U.S. Cl.
CPC .. *H01L 29/66545* (2013.01); *H01L 29/66871* (2013.01); *H01L 29/78* (2013.01); *H01L 29/66553* (2013.01)

(56) References Cited

U.S. PATENT DOCUMENTS

| | | | |
|---|---|---|---|
| 5,879,998 | A | 3/1999 | Krivokapic |
| 6,025,635 | A | 2/2000 | Krivokapic |
| 6,348,385 | B1 | 2/2002 | Cha et al. |
| 6,673,683 | B1 | 1/2004 | Sheu et al. |
| 6,821,855 | B2 | 11/2004 | Juengling et al. |
| 7,078,282 | B2 | 7/2006 | Chau et al. |
| 8,558,305 | B2 | 10/2013 | Zara |
| 9,287,403 | B1 * | 3/2016 | Lee .................. H01L 29/6656 |
| 9,306,022 | B1 | 4/2016 | Oh |
| 9,508,820 | B2 | 11/2016 | Yoo |
| 9,660,050 | B1 | 5/2017 | Cai et al. |
| 9,853,123 | B2 * | 12/2017 | Hung .................. H01L 23/485 |
| 9,865,703 | B2 | 1/2018 | Ando et al. |
| 10,164,039 | B2 | 12/2018 | Liou et al. |
| 10,177,148 | B2 | 1/2019 | Ha et al. |
| 10,431,661 | B2 * | 10/2019 | Liu .................. H01L 29/66553 |
| 2001/0045608 | A1 | 11/2001 | Tseng et al. |
| 2003/0181011 | A1 | 9/2003 | Curro et al. |
| 2004/0043573 | A1 | 3/2004 | Juengling et al. |
| 2004/0137688 | A1 | 7/2004 | Chang et al. |
| 2005/0090066 | A1 | 4/2005 | Zhu et al. |
| 2005/0158935 | A1 | 7/2005 | Shin et al. |
| 2006/0091432 | A1 | 5/2006 | Guha et al. |
| 2006/0223260 | A1 | 10/2006 | Henson |
| 2009/0001437 | A1 | 1/2009 | Won et al. |
| 2009/0029523 | A1 | 1/2009 | Seo et al. |
| 2009/0108342 | A1 | 4/2009 | Wang et al. |
| 2009/0189201 | A1 | 7/2009 | Chang et al. |
| 2009/0206406 | A1 | 8/2009 | Rachmady et al. |
| 2009/0212332 | A1 | 8/2009 | Wang et al. |
| 2011/0186915 | A1 | 8/2011 | Scheiper et al. |
| 2011/0195550 | A1 | 8/2011 | Chang et al. |
| 2011/0220990 | A1 | 9/2011 | Chang et al. |
| 2012/0139062 | A1 | 6/2012 | Yuan et al. |
| 2013/0032900 | A1 | 2/2013 | Hou et al. |
| 2014/0027824 | A1 | 1/2014 | Park et al. |
| 2014/0061781 | A1 | 3/2014 | Kim |
| 2014/0124875 | A1 | 5/2014 | Chung et al. |
| 2014/0131809 | A1 | 5/2014 | Ando et al. |
| 2014/0167119 | A1 | 6/2014 | Javorka et al. |
| 2014/0239417 | A1 | 8/2014 | Wang et al. |
| 2015/0014788 | A1 * | 1/2015 | Park .................. H01L 29/66795 257/401 |
| 2015/0035073 | A1 | 2/2015 | Ando et al. |
| 2015/0115375 | A1 | 4/2015 | Yoo |
| 2016/0079384 | A1 | 3/2016 | He et al. |
| 2016/0163825 | A1 | 6/2016 | Yin et al. |
| 2016/0254360 | A1 | 9/2016 | Wang et al. |
| 2017/0117380 | A1 * | 4/2017 | Lu .................. H01L 23/485 |
| 2017/0125548 | A1 * | 5/2017 | Hung .................. H01L 23/535 |
| 2017/0207312 | A1 | 7/2017 | Jan et al. |
| 2017/0213826 | A1 | 7/2017 | Kim et al. |
| 2017/0236938 | A1 | 8/2017 | Basker et al. |
| 2017/0358665 | A1 | 12/2017 | Song et al. |
| 2018/0337053 | A1 | 11/2018 | Huang et al. |
| 2018/0350932 | A1 * | 12/2018 | Liu .................. H01L 29/42376 |
| 2019/0304975 | A1 * | 10/2019 | Matsumoto ..... H01L 21/823828 |

FOREIGN PATENT DOCUMENTS

| | | |
|---|---|---|
| WO | WO-00/77828 A2 | 12/2000 |
| WO | WO-2016/028267 A1 | 2/2016 |

\* cited by examiner

MITIGATION OF TIME DEPENDENT DIELECTRIC BREAKDOWN

CROSS-REFERENCE TO RELATED APPLICATION

This application is a continuation of U.S. Non-Provisional patent application Ser. No. 15/599,045, filed on May 18, 2017 and titled "Mitigation of Time Dependent Dielectric Breakdown," which is incorporated by reference herein in its entirety.

BACKGROUND

Advances in semiconductor manufacturing of integrated circuits (ICs) have resulted in a steady reduction of the ICs' dimensions. This reduction may limit the spacing between, for example, a transistor's gate and its adjacent source/drain (S/D) contacts. Consequently, the interlayer dielectric (ILD)—which electrically isolates the gate from the S/D contacts—can become susceptible to leakage current during normal transistor operation.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
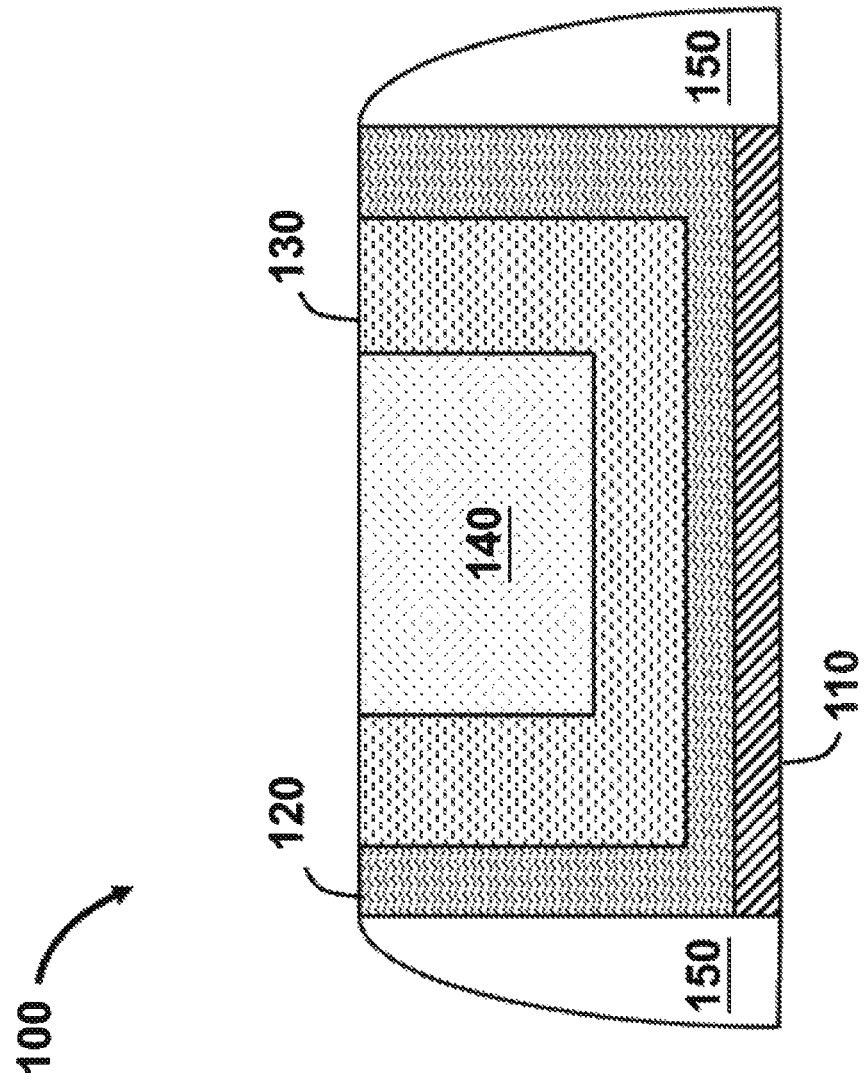
FIG. 1 shows an exemplary gate structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, technical and scientific terms used herein have the same meanings as commonly understood by one of ordinary skill in the art to which this disclosure belongs.

Advances in semiconductor manufacturing of integrated circuits (ICs) have resulted in a steady reduction of the ICs' dimensions. This reduction can increase the density of the transistors but may limit the spacing between, for example, a transistor's gate and its adjacent source/drain (S/D) contacts. Consequently, the inter layer dielectric (ILD)—which electrically isolates the gate from the S/D contacts—may become susceptible to leakage current during normal transistor operation, or conduct current if the applied voltage becomes greater than the ILD's breakdown voltage.

Breakdown voltage is a characteristic of a dielectric material that defines the maximum voltage that the dielectric material can withstand before the dielectric begins to conduct current. Current conduction through a dielectric material is not desired and can compromise a product's reliability, shorten the product's lifetime, and create irreversible material damages to the dielectric. One of the parameters that can affect the breakdown voltage value of a dielectric material is the dielectric's thickness. For example, a thicker dielectric material can exhibit a larger breakdown voltage from a thinner one of the same kind. Additional material properties that can affect the dielectric's insulating performance are, for example, its energy band-gap, its dielectric strength, its dielectric constant, its mass density, its sensitivity to contaminants such as alkali ions, and its sensitivity to radiation.

Time dependent dielectric breakdown (TDDB) is a method used in the semiconductor industry to evaluate the performance of a dielectric material under certain thermal and electrical "stress conditions." For example, during a TDDB test, the leakage current (or another electrical parameter) between the transistor's gate and the S/D contacts is monitored while the dielectric is subjected to voltage sweeps between 10 Volts to 100 Volts at wafer temperatures between 125° C. to 150° C. TDDB tests can be used to address reliability concerns. It is required that ICs pass the TDDB tests.

ICs that have limited space between their transistor gates and the neighboring S/D contacts may become susceptible to TDDB failures. Improving the transistor's electric characteristics and preventing, or minimizing, leakage currents can be challenging due to the ICs scaling requirements. Additionally, voltage scaling may not be always possible, and replacement of the dielectric material may increase the manufacturing cost and complicate the IC fabrication process (integration). To address the above shortcomings, embodiments described herein are directed to an introduction of a spacer layer during the transistor's replacement metal gate process. The addition of a spacer layer may effectively "increase" the thickness of a "dielectric stack" between the transistor's gate and the S/D contacts. In other words, a leakage current originating from the gate will have to travel through a thicker stack of dielectric materials in order to reach the S/D contact—which in turn can reduce the TDDB failures.

A gate structure includes a gate stack and a pair of spacers abutting the gate stack. In a replacement metal gate process, the gate stack of the gate structure is sacrificial and can be replaced. By way of example and not limitation, the sacrificial gate stack can include a polysilicon (poly) gate electrode disposed over a silicon oxide ($SiO_2$) gate dielectric layer. The sacrificial gate stack, also referred to as a "dummy" gate stack, does not have an electrical function. In subsequent operations, the poly gate electrode is removed with a wet etching process known as "poly open (PO) process." Another wet etch process can be used to remove the $SiO_2$ dielectric layer. During the PO process the spacers of the gate structure are not removed. Once the dummy gate stack is removed, it can be replaced by a high dielectric constant (high-k dielectric) material and a metal gate electrode. As would be understood by a person of ordinary skill in the art, both the high-k dielectric and the metal gate electrode may include more than one layers. In other words, the high-k dielectric and the metal gate electrode can be multilayer stacks.

FIG. 1 shows an exemplary gate structure 100 of an exemplary transistor. According to some embodiments, gate structure 100 may include a gate stack—which further includes an interfacial layer (IL) 110, a high-k dielectric 120, a multiple gate (MPG) metal stack 130, a metal fill layer 140—and a pair of spacers 150 abutting the gate stack.

IL 110 can be a native oxide which may grow after the PO process. By way of example and not limitation, IL 110 can be a 20 Å to 30 Å thick $SiO_2$ film. IL 110 can be grown through an oxidation process that occurs naturally when a semiconductor surface, such as silicon (Si), is exposed to atmosphere. In some embodiments, IL 110 formation cannot be avoided. High-k dielectric 120 can be deposited by atomic layer deposition (ALD) and its thickness can range from 10 Å to 20 Å. In some embodiments, the high-k dielectric can be hafnium oxide ($HfO_2$), a hafnium silicate-based material, or another suitable dielectric material with dielectric constant (k-value) greater than 3.9—which is the dielectric constant of $SiO_2$ and is used as a reference.

MPG metal stack 130 can include a capping layer for high-k dielectric 120, one or more metallic layers, and a work function metal (WFM) stack. For simplicity, the capping layer, the one or more metallic layers, and the work function metal (WFM) stack are not individually depicted within MPG metal stack 130 of FIG. 1. In some embodiments, the capping layer for high-k dielectric 120 can be deposited with ALD. ALD is a deposition method that can provide controlled layer growth. In some embodiments, the capping layer for high-k dielectric 120 can have a thickness that ranges from 5 Å to 15 Å. The capping layer for high-k dielectric 120 is used to protect high-k dielectric 120 from subsequent processing operations—e.g., the formation of the one or more metallic layers of MPG stack 130. In some embodiments, the capping layer for high-k dielectric 120 is a Ti-based material.

The number and type of metallic layers in MPG stack 130 may depend on the transistor's threshold voltage requirements. Exemplary metallic layers in MPG stack 130 may include a tantalum nitride (TaN) bottom layer and one or more titanium nitride (TiN) layers. In some embodiments, the TaN bottom layer is deposited with chemical vapor deposition (CVD). By way of example and not limitation, the thickness of the TaN bottom layer can range from 10 Å to 15 Å. In some embodiments, the one or more TiN layers can be formed with an ALD or a diffusion process. The TiN layers deposited with an ALD process can have a thickness between 8 Å and 12 Å, while the TiN layers deposited with a diffusion process can be thicker, e.g., with a thickness ranging from 12 Å to 50 Å.

In some embodiments, the WFM stack can include titanium/aluminum (Ti/Al) bi-layers or a Ti—Al alloy, both of which can be deposited with an ALD process. By way of example and not limitation, the WFM stack can have a thickness range between 20 Å to 35 Å. The WFM stack can fine tune the work function of the metal gate electrode and influence the threshold voltage of the transistor. As would be understood by a person of ordinary skill in the art, the thickness and the number of the one or more TiN layers, in combination with the WFM stack, can set the transistor's threshold voltage.

In some embodiments, metal fill layer 140 can include a TiN barrier layer and a tungsten (W) metal stack. The TiN barrier layer, which can be deposited with an ALD process, can protect the underlying WFM stack from the fluorine chemistry used during the deposition of the W metal stack. According to some embodiments, the thickness of the TiN barrier layer can be between 40 Å and 50 Å. In some embodiments, the W metal stack can be deposited in a two-step process, where a thin layer is deposited first and a thick layer is deposited second. The first layer is deposited with an ALD process and its thickness can range from 30 Å to 40 Å. The first layer can have a smaller grain size and can fill the gate stack. The second layer can be deposited with a CVD process and its thickness can range from 1000 nm to 1500 nm. The thick layer is referred to as the "overburden" and can extend over the gate structure. As would be understood by a person of ordinary skill in the art, the first ALD-deposited W layer can substantially fill the gate stack of gate structure 100, while the second CVD-deposited W layer (overburden) can be grown over gate structure 100. The overburden layer can assist with the subsequent chemical mechanical planarization (CMP) process and can be polished away (removed) during the CMP process. The overburden layer is not shown in FIG. 1 for simplicity.

In some embodiments, spacers 150 can be made of a dielectric material, such as Sift, silicon oxynitride (SiON), carbon-doped silicon nitride (SiCN), silicon oxycarbide ($SiO_xC_y$), or silicon nitride ($Si_xN_y$). In some embodiments, the thickness of spacers 150 can range from 2 nm to 5 nm. As would be understood by a person of ordinary skill in the art, spacers 150 can be a stack of one or more layers made of the same or different materials. In some embodiments, spacers 150 can be used as alignment masks during the formation of the transistor's S/D regions 215. According to some embodiments, spacers 150 are not removed during the dummy gate stack removal process and can serve as structural elements of gate structure 100.

Figure 2:
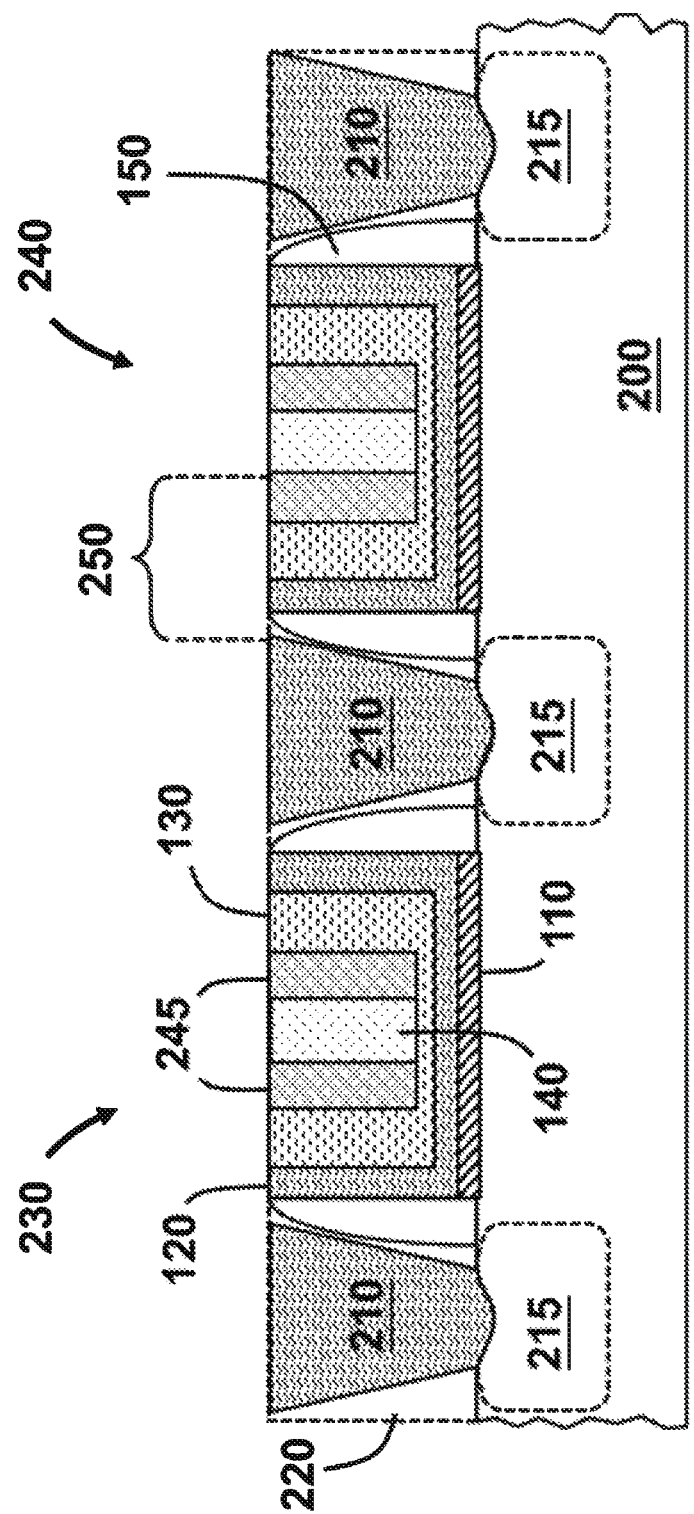
FIG. 2 shows two neighboring exemplary gate structures with spacer layers in their gate stacks, according to some embodiments.

FIG. 2 shows two neighboring gate structures 230 and 240 formed over an exemplary substrate 200. According to some embodiments, gate structures 230 and 240 feature gate stacks with additional spacer layers 245. S/D contacts 210 are formed adjacent to the gate structures, and an interlayer dielectric (ILD) layer 220 is disposed between S/D contacts 210 and gate structures 230 and 240. S/D contacts 210 are connected to S/D regions 215 of substrate 200. By way of example and not limitation, S/D regions 215 can be boron doped SiGe for p-type field effect transistors (PFETs) and carbon doped silicon (Si:C) for n-type field effect transistors (NFETs). In some embodiments, S/D contacts 215 are grown epitaxially. In some embodiments, exemplary substrate 200 can be a bulk semiconductor wafer or the top layer of a semiconductor on insulator (SOI) wafer. Alternatively, substrate 200 can be a fin that is perpendicular to the wafer's top surface. By way of example and not limitation, substrate 200 can be made of silicon or another elementary semiconductor such as, for example, germanium. Alternatively, substrate 200 can be: (i) a compound semiconductor including silicon carbide, gallium arsenide (GaAs), gallium phosphide (GaP), indium phosphide (InP), indium arsenide (InAs), and/or indium antimonide (InSb); (ii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iii) combinations thereof.

In some embodiments, ILD 220 can be made of $SiO_2$, $SiO_xC$, SiON, silicon-oxy-carbon nitride (SiOCN), silicon carbide (SiC), or silicon carbon nitride (SiCN). As would be understood by a person of ordinary skill in the art, ILD 220 can provide electrical isolation to gate stacks 230 and 240, and S/D contacts 210. ILD 220 can be deposited with CVD, flowable CVD, physical vapor deposition (PVD), or can be thermally grown. By way of example and not limitation, S/D contacts 210 can be filled with a metal such as tungsten (W), cobalt (Co), or aluminum (Al). These metals can be deposited with CVD, ALD, PVD, plasma-enhanced CVD (PECVD) or plasma-enhanced ALD (PEALD). According to some embodiments, contacts 210 can include a barrier layer which can be deposited before the metal deposition. Such barrier layer can be, for example, a Ti/TiN stack. According to some embodiments, S/D contacts 210 can provide electrical connections to S/D regions 215 of the transistor.

A spacing 250 can be defined by a distance between the edge of S/D contact 210 and an edge of metal fill layer 140 of gate structure 240. In some embodiments, spacing 250 can range from 10 nm to 25 nm. According to some embodiments, a larger spacing 250 can result in a lower leakage current between a S/D contact 210 and an adjacent gate structure (230 or 240) during a TDDB stress test. In some embodiments, spacing 250 can become larger with the introduction of additional spacer layer 245, which can be formed before the formation of metal fill layer 140 in the gate stack of gate structures 230 and 240. In some embodiments, an increase in spacing 250 does not affect the gate pitch—the distance between two neighboring gate structures, such as gate structures 230 and gate structures 240.

Figure 3:
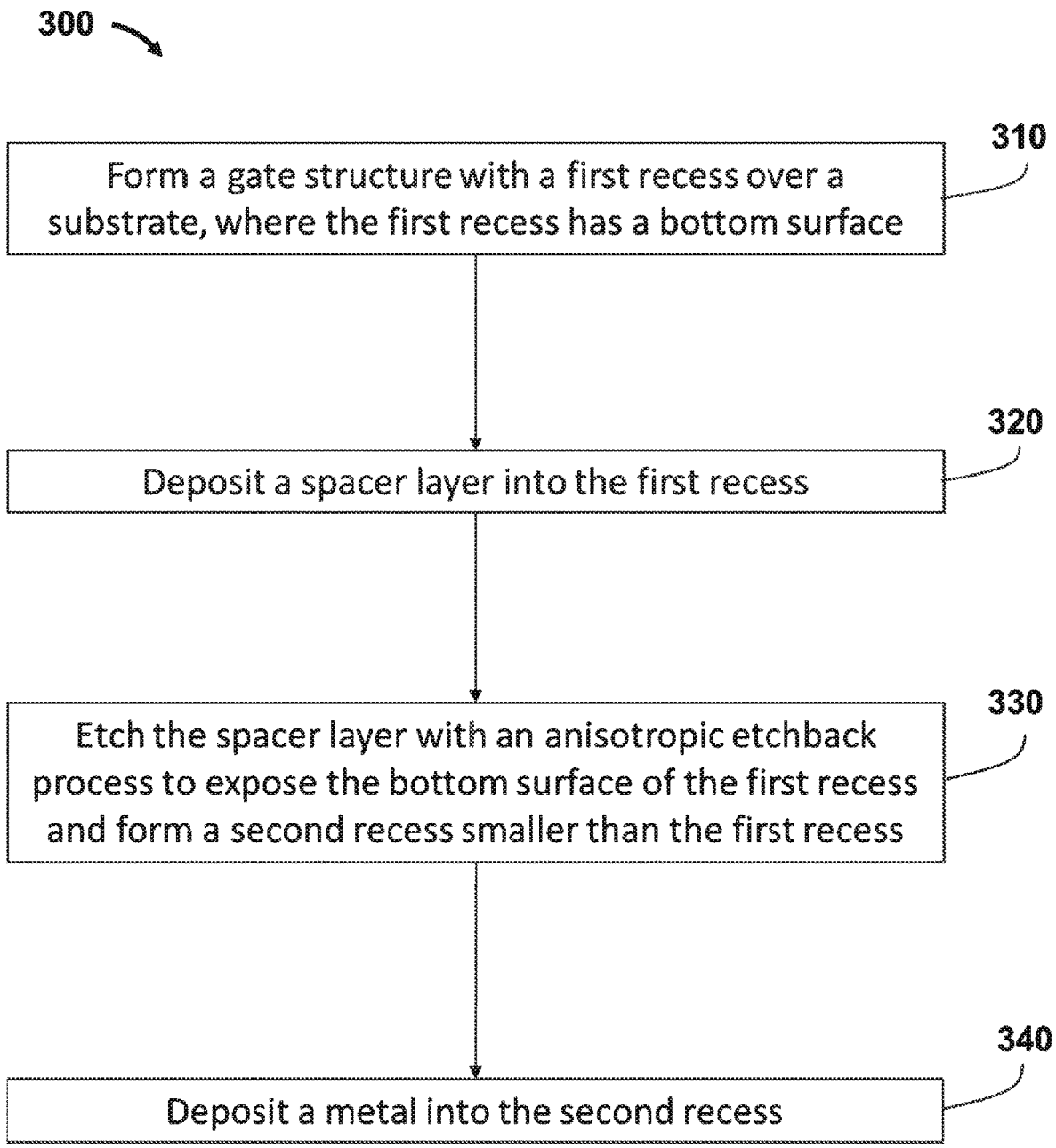
FIG. 3 shows a flow chart diagram of an exemplary replacement gate process that forms spacer layers in the gate stack to mitigate time dependent dielectric breakdown (TDDB) failures, according to some embodiments.

FIG. 3 shows a flow chart diagram of an exemplary replacement metal gate process 300 that forms additional spacer layers in the gate stack of a gate structure to mitigate TDDB failures. Other fabrication operations may be performed between the various operations of replacement metal gate process 300 and are omitted for clarity. As would be understood by a person of ordinary skill in the art, the exemplary replacement metal gate process 300 may not be limited to the operation steps described below.

Figure 4:
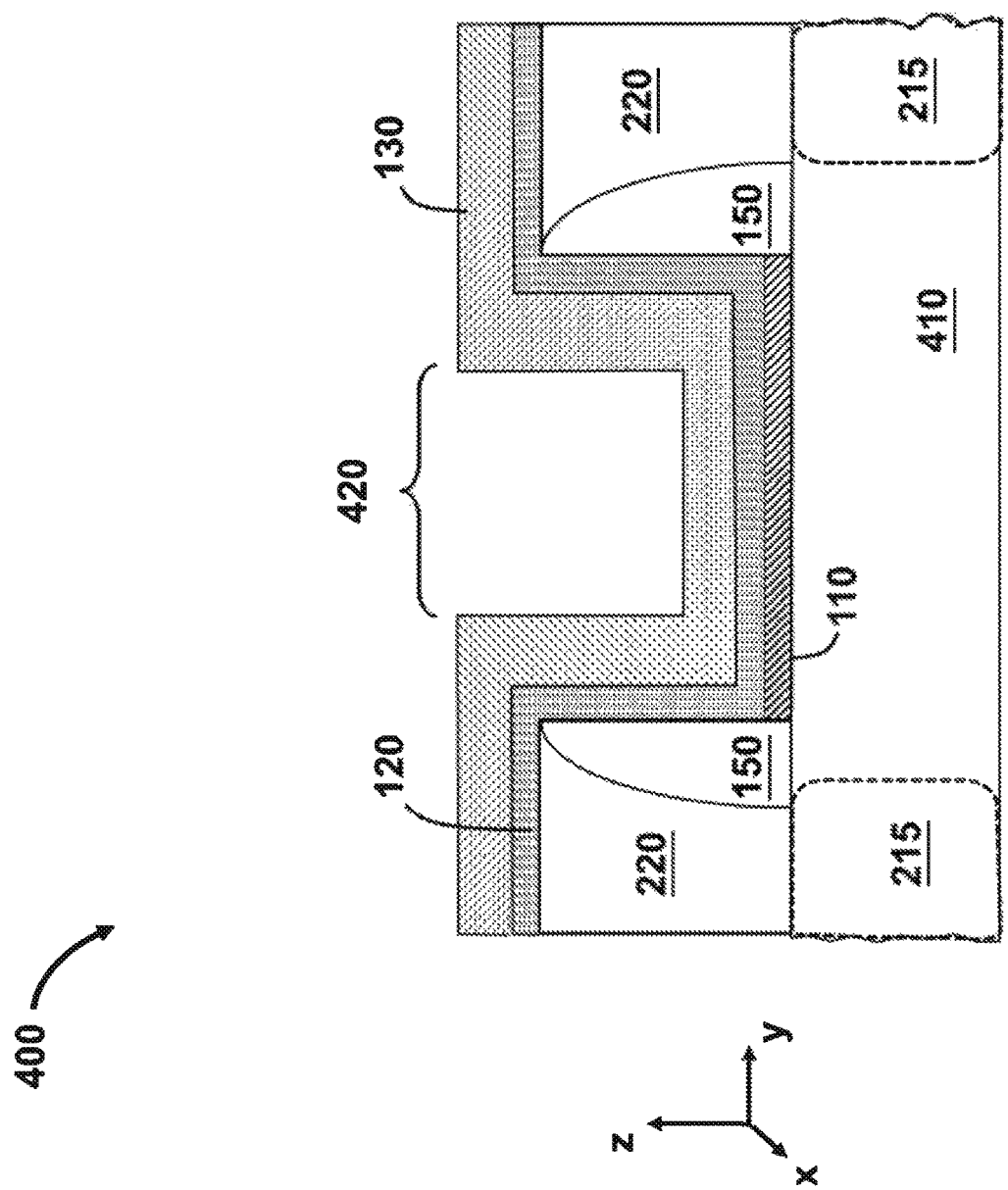
FIG. 4 shows a partially fabricated gate structure that includes an interfacial layer, a high-k dielectric, and a multiple gate metal layer, according to some embodiments.

Exemplary replacement metal gate process 300 begins with operation 310 and the formation of a gate structure, which can be considered a partially fabricated gate structure according to some embodiments. Such a partially fabricated gate structure is formed, for example, when the sacrificial gate stack of the gate structure has been removed and is being replaced by the IL, the high-k dielectric, and the MPG metal stack. An exemplary partially fabricated gate structure 400 is depicted in FIG. 4. Gate structure 400 can be disposed on fin 410 and, by way of example and not limitation, can include an IL 110, a high-k dielectric 120, an MPG metal stack 130, and spacers 150. At this stage of the fabrication process, a recess 420 is formed due to the conformal deposition of high-k dielectric 120 and MPG metal stack 130. In some embodiments, recess 420 can be considered an opening or a trench that extends along the length (x-direction) of gate structure and is perpendicular to the length (y-direction) of fin 410. As would be understood by a person of ordinary skill in the art, spacers 150 can provide the inner side and outer side surfaces of the partially fabricated gate structure 400.

In some embodiments, fin 410 can be made of silicon, another elementary semiconductor (germanium), or a compound semiconductor. As would be understood by a person of ordinary skill in the art, partially fabricated gate structure 400 can be formed on a planar surface of a semiconductor wafer or on a planar surface of an SOI wafer instead of fin 410. Similar to gate structures 230 and 240, which are depicted in FIG. 2, partially fabricated gate structure 400 is surrounded by ILD layer 220. As discussed above, ILD layer 220 can electrically isolate partially fabricated gate structure 400 from adjacent S/D contacts 215. IL 110 covers the bottom surface of the partially fabricated gate structure 400 and is formed directly on fin 410 after the poly removal process, according to some embodiments. In some embodiments, IL 110 is a native oxide layer formed on a bottom of the partially fabricated gate structure 400—e.g., top surface of fin 410—between the pair of spacers 150. According to some embodiments, IL 110 can be a 20 Å to 30 Å thick $SiO_2$ film grown through an oxidation process that occurs naturally when a semiconductor surface, such as silicon (Si), is exposed to the atmosphere.

High-k dielectric 120 can be "blanket-deposited" in opening 430 to conformally cover exposed surfaces. This means that high-k dielectric 130 is deposited over IL 100, over the inner side surfaces of spacers 150 and over ILD 220. High-k dielectric 120 can be deposited with an ALD process and its thickness can range from 10 Å to 20 Å. In some embodiments, the high-k dielectric can be $HfO_2$, a hafnium silicate-based material, or another suitable dielectric material with k-value greater than 3.9.

MPG metal stack 130 can be conformally formed over high-k dielectric 120 as shown in FIG. 4. As discussed above, MPG metal stack 130 can include a capping layer for high-k dielectric 120, one or more metallic layers, and a WFM stack. In FIG. 4, the capping layer for high-k dielectric 120, the one or more metallic layers, and the WFM stack are not individually depicted in MPG metal stack 130 for simplicity. In some embodiments, the capping layer for high-k dielectric 120 can be deposited with an ALD process and have a thickness that ranges from 5 Å to 15 Å. The capping layer for high-k dielectric 120 can be used to protect high-k dielectric 120 from subsequent processing operations—e.g., the formation of the one or more metallic layers of MPG stack 130. In some embodiments, the capping layer for high-k dielectric 120 is a Ti-based material.

The number and type of metallic layers in MPG stack 130 may depend on the transistor's threshold voltage requirements. Exemplary metallic layers in MPG stack 130 may include a TaN bottom layer and one or more TiN layers. In some embodiments, the TaN bottom layer is deposited with a CVD process and its thickness can range from 10 Å to 15 Å. In some embodiments, the one or more TiN layers can be formed with an ALD or a diffusion process. The TiN layers deposited with an ALD process can have a thickness between 8 Å and 12 Å, while the TiN layers deposited with a diffusion process can be thicker, with a thickness ranging from 12 Å to 50 Å.

In some embodiments, the WFM stack can include Ti/Al bi-layers or a Ti—Al alloy that can be deposited with ALD. By way of example and not limitation, the WFM stack can have a thickness range between 20 to 35 Å. The WFM stack can be used to adjust the work function of the metal gate electrode. The work function of the metal gate electrode can influence the transistor's threshold voltage. As would be understood by a person of ordinary skill in the art, the thickness and the number of the one or more TiN layers in combination with the WFM stack can adjust the transistor's threshold voltage. As shown in FIG. 4, the deposition of high-k dielectric 120 and MPG metal stack 130 forms recess 420. According to some embodiments, recess 420 can have an aperture (width) across the width of gate structure 400 (y-direction) between 10 nm to 15 nm.

Figure 5:
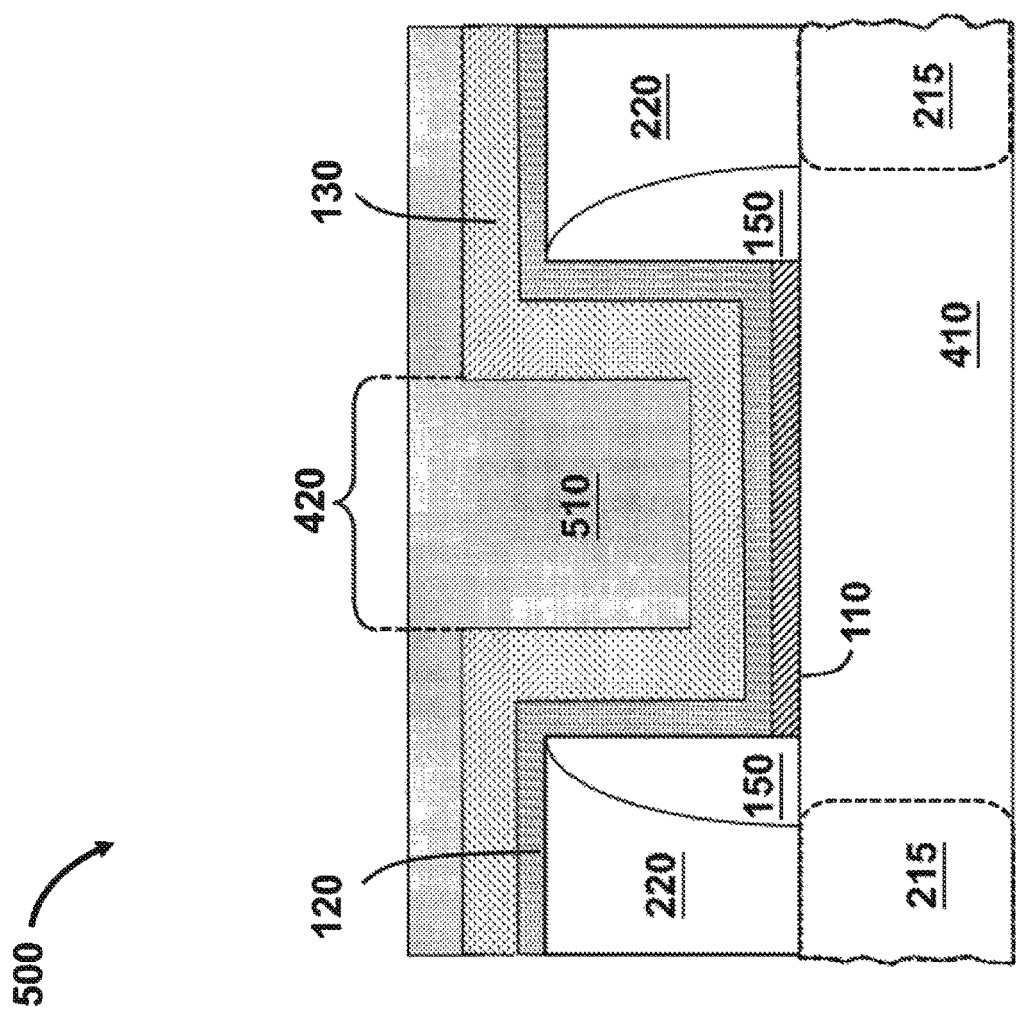
FIG. 5 shows a partially fabricated gate structure after deposition of a spacer layer, according to some embodiments.

In referring to FIG. 3, exemplary replacement metal gate process 300 continues with operation 320 where a spacer layer 510 can be deposited over MPG metal stack 130 in recess 420 of partially fabricated stack 500 as depicted in FIG. 5. In some embodiments, the deposition of spacer layer 510 is a blanket deposition that may or may not fill recess 420 and can extend over ILD 220. By way of example and not limitation, spacer layer 510 can be deposited with CVD, ALD, PECVD, or PEALD depending on the gap fill requirements. In some embodiments, the "as-deposited" thickness of spacer layer 510 can range from 5 nm to 10 nm depending on the aperture of recess 420. According to some embodiments, spacer layer 510 can be, for example, silicon nitride ($Si_3N_4$ or "SiN"). $Si_3N_4$ is a dielectric material that has a dielectric strength value of about 10 MV/cm and a k-value between 6 and 7. In some embodiments, other silicon nitride-based materials may be used such as, for example, SiON, SiCN, or $SiO_xC_y$. In some embodiments, spacer layer 510 is conformal and uniform and may fill recess 420 with minimal or no voids.

Figure 6:
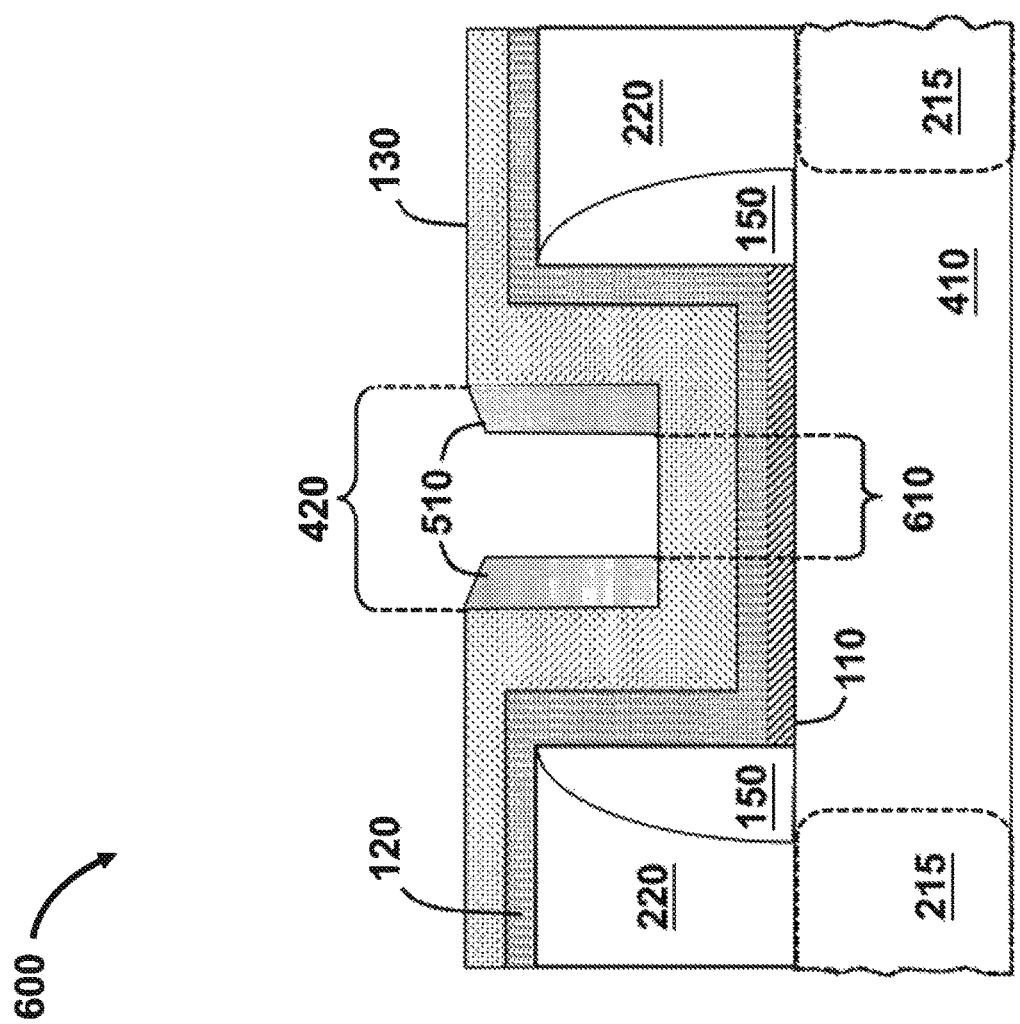
FIG. 6 shows a partially fabricated gate structure after an exemplary etchback process that removes portions of the spacer layer, according to some embodiments.

In referring to FIG. 3, exemplary replacement metal gate process 300 continues with operation 330, where spacer layer 510 is subjected to an anisotropic etchback (EB) process. FIG. 6 shows a partially fabricated gate structure 600 after an exemplary EB process. The EB process can be optimized to remove (etch) the spacer layer material faster from the horizontal surfaces than from the vertical surfaces of a structure. Vertical surfaces are, for example, the inner side surfaces of recess 420. Horizontal surfaces are, for example, the bottom surface of recess 420 and the surfaces over ILD layer 220. A result of the EB process can be recess 610 which can be formed in spacer layer 510. The EB process continues until spacer layer 510 on the horizontal surfaces is removed and MPG metal stack 130 is exposed. In some embodiments, the aperture of recess 610 is smaller than the aperture of recess 420. In some embodiments, recess 610 can be considered an opening or a trench which extents along the entire length (x-direction) of gate structure 600 and is perpendicular to the length (y-direction) of fin 410.

As would be understood by a person of ordinary skill in the art, an anisotropic etch can remove a material faster in a direction perpendicular to the wafer's surface than in a direction parallel to the wafer's surface. The amount of anisotropy, or "directional selectivity," can be adjusted through the EB process conditions. According to some embodiments, the EB process can be a dry etch process that may use carbon fluoride ($CF_x$)-based plasma and can provide etch rates up to 5 Å/sec. In some embodiments, spacer layer 510 can cover only the inner side surfaces of recess 420. In some embodiments, the thickness of spacer layer 510 over the inner side surfaces of recess 420 can range from 0 nm to 2.5 nm, and recess 610 can have an aperture that can range from 0 nm to 5 nm.

Figure 7:
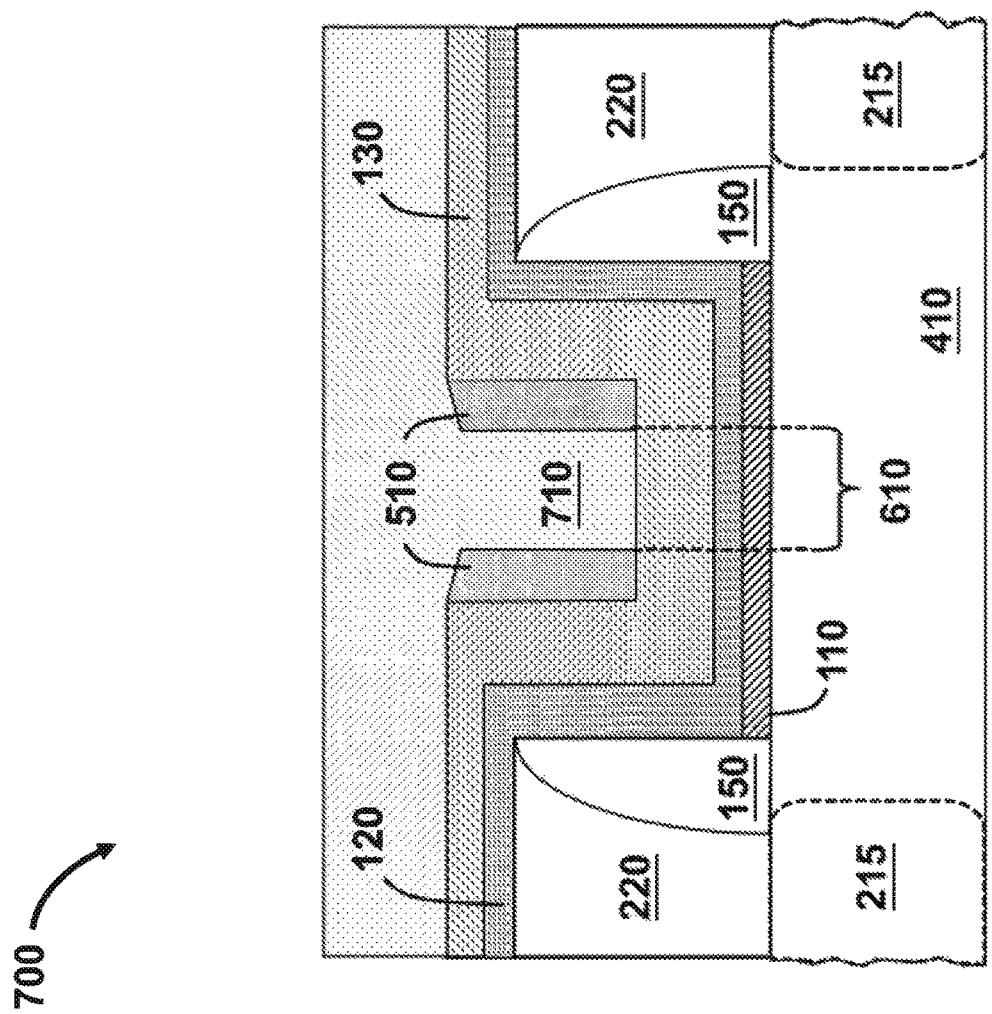
FIG. 7 shows a partially fabricated gate structure after deposition of a metal fill layer, according to some embodiments.

In referring to FIG. 3, exemplary replacement metal gate process 300 continues with operation 340 where a metal fill layer is deposited in recess 610 of the partially fabricated gate structure 600. FIG. 7 shows an exemplary partially fabricated gate structure 700 after metal fill layer 710 deposition. According to some embodiments, metal fill layer 710 can fill recess 610 and extend over spacer layer 510 and MPG metal stack 130. In some embodiments, metal fill layer 710 can include a TiN barrier layer and W metal stack. The TiN barrier layer can be deposited first with an ALD process. In some embodiments TiN barrier layer can protect the underlying WFM stack from the fluorine chemistry used in the W metal stack deposition process. According to some embodiments, the thickness of the TiN barrier layer can range from 40 Å to 50 Å. In some embodiments, the W metal stack can be deposited in a two-step process. For example, a first thin layer can be deposited with an ALD process to fill recess 610. The thickness of the first thin layer can range from 30 Å to 40 Å. A second thick layer can be deposited with a CVD process. The second thick layer can have a thickness range between 1000 nm and 1500 nm and it can extend over the partially fabricated gate structure 700. The second thicker layer is referred to as "overburden." As would be understood by a person of ordinary skill in the art, the first ALD-deposited W layer can substantially fill recess 610, while the second CVD-deposited W layer can be grown over the partially fabricated gate stack 700. In some embodiments, the overburden layer can assist with the subsequent chemical mechanical planarization (CMP) process and can be polished away (removed) during the CMP process.

Figure 8:
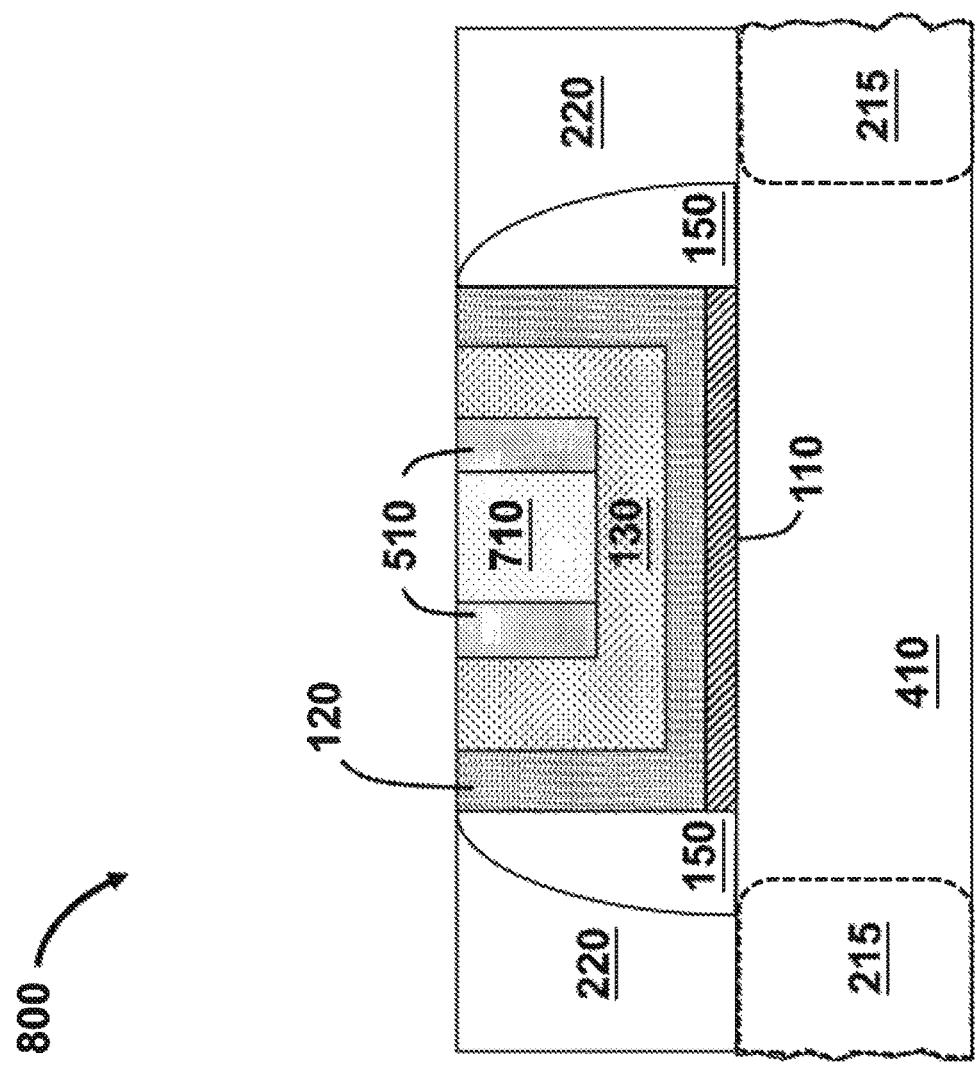
FIG. 8 shows a gate structure with additional spacer layers and a metal fill layer after a planarization step, according to some embodiments.

The CMP process can remove the W overburden layer and the layers from the top surface of ILD layer 220, until the top surface of ILD layer 220 is exposed and planar. According to some embodiments, the CMP process can remove a portion of metal fill layer 710, a portion of MPG metal stack 130, a portion of spacer layer 510, and a portion of high-k dielectric 120 from the top surface of ILD layer 220. According to some embodiments, FIG. 8 shows a fabricated gate structure 800 after the completion of the aforementioned CMP process. According to FIG. 8, the top surface of gate structure 800 and the top surface of the ILD layer 220 are aligned (flushed).

According to some embodiments, FIG. 2 shows gate structures 230 and 240 that have been fabricated using exemplary replacement metal gate process 300. Gate structures 230 and 240 can include spacer layers 245. Spacing 250 can be defined as the distance between the edge of metal fill layer 140 and the edge of S/D contact 210. Spacing 250 includes the width of the spacer layer 245. In some embodiments, the thickness of spacer layer 245 of gate structures 230 or 240 can be up to 2.5 nm. Hence, spacing 250 can be up to 2.5 nm wider than a spacing between a gate without additional spacer layers 245 and a S/D contact 210. The addition of spacer layer 245 can effectively increase the thickness of the dielectric stack between a transistor gate structure (e.g., 230 or 240) and a S/D contacts (e.g., 210), and can therefore prevent or minimize leakage current losses during a TDDB test.

The embodiments described herein are directed to a method that introduces a spacer layer during the transistor's metal gate replacement process. The spacer layer can be introduced into the gate replacement process flow after the deposition of the MPG metal stack and before the metal fill layer deposition. The addition of a spacer layer may effectively "increase" the thickness of the "dielectric stack" between the metal fill layer of the transistor's gate and the neighboring S/D contacts. A benefit from this approach can be an improvement in a transistor's performance during reliability testing, e.g., during a TDDB test, without the need for a contact-to-gate pitch change. In addition, the spacer layer formation can be integrated with the metal gate replacement process and the spacer layer thickness can be adjusted through the EB process to range from 0 nm to 2.5 nm, depending on the gate stack width.

In some embodiments, a method includes a gate structure with a first recess with a bottom surface formed over a substrate. A spacer layer is deposited into the first recess. A spacer layer is etched with an anisotropic etchback process to expose the bottom surface of the first recess and form a second recess smaller than the first recess. A metal is deposited into the second recess.

In some embodiments, a structure includes a substrate with two opposing spacers on the substrate. A first dielectric is disposed over the substrate between the two opposing spacers and a second dielectric is conformally deposited between the two opposing spacers and over the first dielectric. A multiple gate metal stack is conformally deposited over the second dielectric to form a first recess with two opposing side surfaces. A spacer layer is disposed over the two opposing side surfaces of the first recess to form a second recess smaller than the first recess. A metal deposited into the second recess.

In some embodiments, a method of forming a gate stack includes two opposing spacers formed on a substrate. A first dielectric is formed over the substrate between the two opposing spacers. A second dielectric is conformally deposited between the two opposing spacers and over the first dielectric. A multiple gate metal stack is conformally deposited over the second dielectric to form a first recess with two opposing side surfaces. A spacer layer is deposited over the two opposing side surfaces of the first recess to form a second recess smaller than the first recess. A metal is deposited into the second recess.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a substrate with a dielectric thereon and comprising a first opening;
   forming a first portion of a gate stack comprising a metal stack in the first opening to cover sidewall and bottom surfaces of the first opening, wherein the metal stack forms a second opening in the first opening;
   forming spacers in the second opening and in contact with a bottom surface of the second opening so that the first portion of the gate stack is interposed between the spacers and the sidewall surfaces of the first opening, wherein the spacers form a third opening in the second opening; and
   depositing a second portion of the gate stack on the first portion and the spacers to fill the third opening, wherein the second portion is in contact with the first portion.

2. The method of claim 1, wherein forming the first portion of the gate stack comprises:
   forming an interfacial layer on the bottom surface of the first opening;
   depositing conformally a high-k dielectric on the interfacial layer and the sidewall surfaces of the first opening; and
   depositing conformally the metal stack on the high-k dielectric, wherein the metal stack comprises capping layers and work function layers.

3. The method of claim 1, wherein forming the spacers comprises:
   depositing a spacer layer comprising a dielectric material on the first portion of the gate stack; and
   etching the spacer layer to remove the spacer layer from top surfaces of the first portion and form the spacers on sidewall surfaces of the first portion.

4. The method of claim 3, wherein depositing the spacer layer comprises depositing silicon nitride ($Si_3N_4$), silicon oxynitride (SiON), carbon-doped silicon nitride (SiCN), or silicon oxycarbide ($SiO_xC_y$).

5. The method of claim 3, wherein depositing the spacer layer comprises depositing a silicon-based layer comprising nitrogen.

6. The method of claim 3, wherein depositing the spacer layer comprises depositing a silicon-based layer comprising carbon.

7. The method of claim 1, wherein depositing the second portion comprises interposing the spacers between the first portion and the second portion.

8. A structure, comprising:
   a substrate;
   a dielectric layer on the substrate and comprising an opening;
   an interfacial layer in the opening and covering a bottom surface of the opening;
   a high-k dielectric conformally deposited on the interfacial layer and sidewall surfaces of the opening, wherein the high-k dielectric is in direct contact with the sidewall surfaces of the dielectric layer;
   a gate stack disposed in the opening and comprising a first portion on the high-k dielectric and a second portion on a top surface of the first portion, wherein the first portion is conformal and conformally covers bottom and sidewall surfaces of the opening and comprises a metal stack, and wherein the second portion is in contact with the metal stack; and
   a first spacer interposed between sidewall surfaces of the metal stack and sidewall surfaces of the second portion, wherein the first spacer is in contact with a top surface of the metal stack.

9. The structure of claim 8, wherein the second portion is in physical contact with the top surface of the first portion.

10. The structure of claim 8, wherein the second portion comprises a metal and the first spacer comprises a dielectric material.

11. The structure of claim 8, wherein the high-k dielectric is interposed between the first portion of the gate stack and the dielectric layer along the sidewall surfaces of the opening.

12. The structure of claim 8, wherein the high-k dielectric and the first spacer are laterally separated by the first portion of the gate stack.

13. The structure of claim 8, wherein the metal stack is conformally deposited on the bottom and sidewall surfaces of the opening.

14. A structure, comprising:
   a substrate;
   a dielectric layer on the substrate;
   an interfacial layer, on the substrate, surrounded by the dielectric layer;
   a high-k dielectric conformally deposited on the interfacial layer and sidewall surfaces of the dielectric layer wherein the high-k dielectric is in direct contact with the sidewall surfaces of the dielectric layer; and
   a gate stack, on the high-k dielectric, surrounded by the dielectric layer, wherein the gate stack comprises:
      a first portion being conformal and conformally covering a top surface and sidewall surfaces of the high-k dielectric, wherein the first portion comprises work function layers;
      a spacer structure abutting bottom and sidewall surfaces of the work function layers; and
      a second portion abutting the spacer structure and in contact with the work function layers,
      wherein the high-k dielectric is interposed between the first portion of the gate stack and the dielectric layer and interposed between the first portion of the gate stack and the substrate.

15. The structure of claim 14, wherein the first portion comprises one or more capping layers conformally disposed on the high-k dielectric, and the work function layers are conformally disposed on the one or more capping layers.

16. The structure of claim 14, wherein the spacer structure is interposed between sidewall surfaces of the first portion and sidewall surfaces of the second portion.

17. The structure of claim 14, wherein the second portion is on a top surface of the first portion.

18. The structure of claim 14, wherein the spacer structure comprises a dielectric material that separates the first portion from the second portion in a lateral direction.

19. The structure of claim 14, wherein the spacer structure comprises a silicon-based carbide.

20. The structure of claim 14, wherein the spacer structure comprises a silicon-based nitride.

* * * * *

UNITED STATES PATENT AND TRADEMARK OFFICE
CERTIFICATE OF CORRECTION

| | |
|---|---|
| PATENT NO. | : 11,398,559 B2 |
| APPLICATION NO. | : 16/851079 |
| DATED | : July 26, 2022 |
| INVENTOR(S) | : Huang et al. |

It is certified that error appears in the above-identified patent and that said Letters Patent is hereby corrected as shown below:

On the Title Page

Item (71), in "Applicant", Line 2, delete "Manufacturing," and insert -- Manufacturing --, therefor.

Signed and Sealed this
Twelfth Day of November, 2024

Katherine Kelly Vidal
*Director of the United States Patent and Trademark Office*